(12) United States Patent
Huang

(10) Patent No.: US 9,363,910 B2
(45) Date of Patent: Jun. 7, 2016

(54) MEMORY STICK

(71) Applicant: HO E SCREW & HARDWARE CO., LTD., Taoyuan (TW)

(72) Inventor: Joseph Huang, Taoyuan (TW)

(73) Assignee: HO E SCREW & HARDWARE CO., LTD., Taoyuan (TW)

( * ) Notice: Subject to any disclaimer, the term of this patent is extended or adjusted under 35 U.S.C. 154(b) by 177 days.

(21) Appl. No.: 14/146,850

(22) Filed: Jan. 3, 2014

(65) Prior Publication Data

US 2015/0195933 A1   Jul. 9, 2015

(51) Int. Cl.
*H05K 5/02*    (2006.01)
*G06K 19/077*    (2006.01)

(52) U.S. Cl.
CPC .......... *H05K 5/0278* (2013.01); *G06K 19/077* (2013.01); *G06K 19/07732* (2013.01)

(58) Field of Classification Search
CPC ............. H05K 5/0278; G06K 19/077; G06K 19/07732
See application file for complete search history.

(56) References Cited

U.S. PATENT DOCUMENTS

| 8,081,483 B2* | 12/2011 | Huang | G06K 19/077 361/752 |
| 8,192,211 B1* | 6/2012 | Huang | H01R 13/447 439/131 |
| 8,475,218 B2* | 7/2013 | Zheng | G02B 6/3817 439/660 |
| 8,760,876 B2* | 6/2014 | Huang | H05K 5/0278 361/737 |
| 9,039,455 B2* | 5/2015 | Hsieh | H01R 31/065 439/638 |
| 2008/0059680 A1* | 3/2008 | Hiew | G06K 19/077 710/301 |
| 2008/0120817 A1* | 5/2008 | Lin | F16B 45/02 24/598.1 |
| 2010/0151719 A1* | 6/2010 | Kung | G06K 19/041 439/358 |
| 2012/0327610 A1* | 12/2012 | Huang | H05K 5/0278 361/740 |
| 2013/0308288 A1* | 11/2013 | Li | G06K 19/07732 361/807 |
| 2014/0340836 A1* | 11/2014 | Hsieh | G06K 19/07732 361/679.32 |

* cited by examiner

*Primary Examiner* — Hoa C Nguyen
*Assistant Examiner* — Keith Depew
(74) *Attorney, Agent, or Firm* — Guice Patents PLLC

(57) ABSTRACT

A memory stick includes a casing having a connection member at a top end thereof for connection to a personal item and an opening at a bottom end thereof, a positioning tray insertable through the opening of the casing for positioning in the casing and having an angled upper bending plate extended from a top end thereof and defining with a bottom wall thereof a clamping space and an elastically deformable recessed portion defined in the angled upper bending plate, and a flash memory detachably inserted into the clamping space of the positioning tray and held down in place by the recessed portion.

4 Claims, 3 Drawing Sheets

MEMORY STICK

BACKGROUND OF THE INVENTION

1. Field of the Invention

The present invention relates to memory stick technology and more particularly, to a memory stick that enhances the positioning of the flash memory.

2. Description of the Related Art

Universal Serial Bus (USB) was designed for connection, communication, and power supply between computers and electronic devices. USB interface devices have been widely used in computers, set-top boxes, game consoles and many other electronic products. With fast development of data storage technology, small-sized high-capacity memory sticks (flash drives) have been continuously created and have appeared on the market.

A conventional memory stick (flash drive) generally comprises a printed circuit board that comprises a flash memory with an integrated Universal Serial Bus (USB) interface, and an electrically insulative flat casing that is formed of two half shells and houses the printed circuit board. Modern memory sticks (flash drives) have been made smaller than ever. Most memory sticks (flash drives) are made in the form of a flat strip. Memory sticks (flash drives) are so small that can easily be lost.

To prevent loss and to facilitate carrying and use, a memory stick may be equipped with connection means, for example, swivel hook or safety hook for connection to a personal item, for example, key ring. Carrying a memory stick with door lock keys and/or vehicle lock keys can prevent loss of the memory stick and facilitate convenient use of the memory stick. However, conventional memory sticks having this kind of function are commonly complicated and not cheap. Further, designing a memory stick connectable to a personal item must consider the convenience of use and positioning stability of the flash memory.

SUMMARY OF THE INVENTION

The present invention has been accomplished under the circumstances in view. It is the main object of the present invention to provide a memory stick, which simplifies the manufacturing and assembly processes, effectively reduces the cost, and greatly enhances the positioning of the flash memory.

To achieve this and other objects of the present invention, a memory stick of the invention comprises a casing, a positioning tray, and a flash memory. The casing comprises a connection member located at a top end thereof for connection to a personal item, an opening located in an opposing bottom end thereof, and a plurality of locating holes symmetrically located in two opposite lateral sides thereof. The positioning tray is insertable through the opening into the inside of the casing, comprising an angled upper bending plate upwardly extended from a top end thereof and defining with a bottom wall thereof a clamping space, an elastically deformable recessed portion defined in the angled upper bending plate, and two elastic arms bilaterally extended from the upper bending plate and respectively terminating in at least one respective hooked end portion. The hooked end portions of the two elastic arms are respectively forced into the locating holes of the casing after insertion of the positioning tray through the opening into the inside of the casing. The flash memory is detachably mounted in the clamping space in the positioning tray and held down by the elastically deformable recessed portion.

Preferably, the positioning tray further comprises at least one protruding press portion located at a bottom side of the recessed portion for pressing flash memory in the clamping space.

Preferably, the positioning tray further comprises at least one elongated slot cut through opposing top and bottom surfaces of the recessed portion. Preferably, the positioning tray comprises a plurality of elongated slots symmetrically located in the recessed portion at two opposite lateral sides.

Other advantages and features of the present invention will be fully understood by reference to the following specification in conjunction with the accompanying drawings, in which like reference signs denote like components of structure.

DETAILED DESCRIPTION OF THE PREFERRED EMBODIMENT

Figure 1:
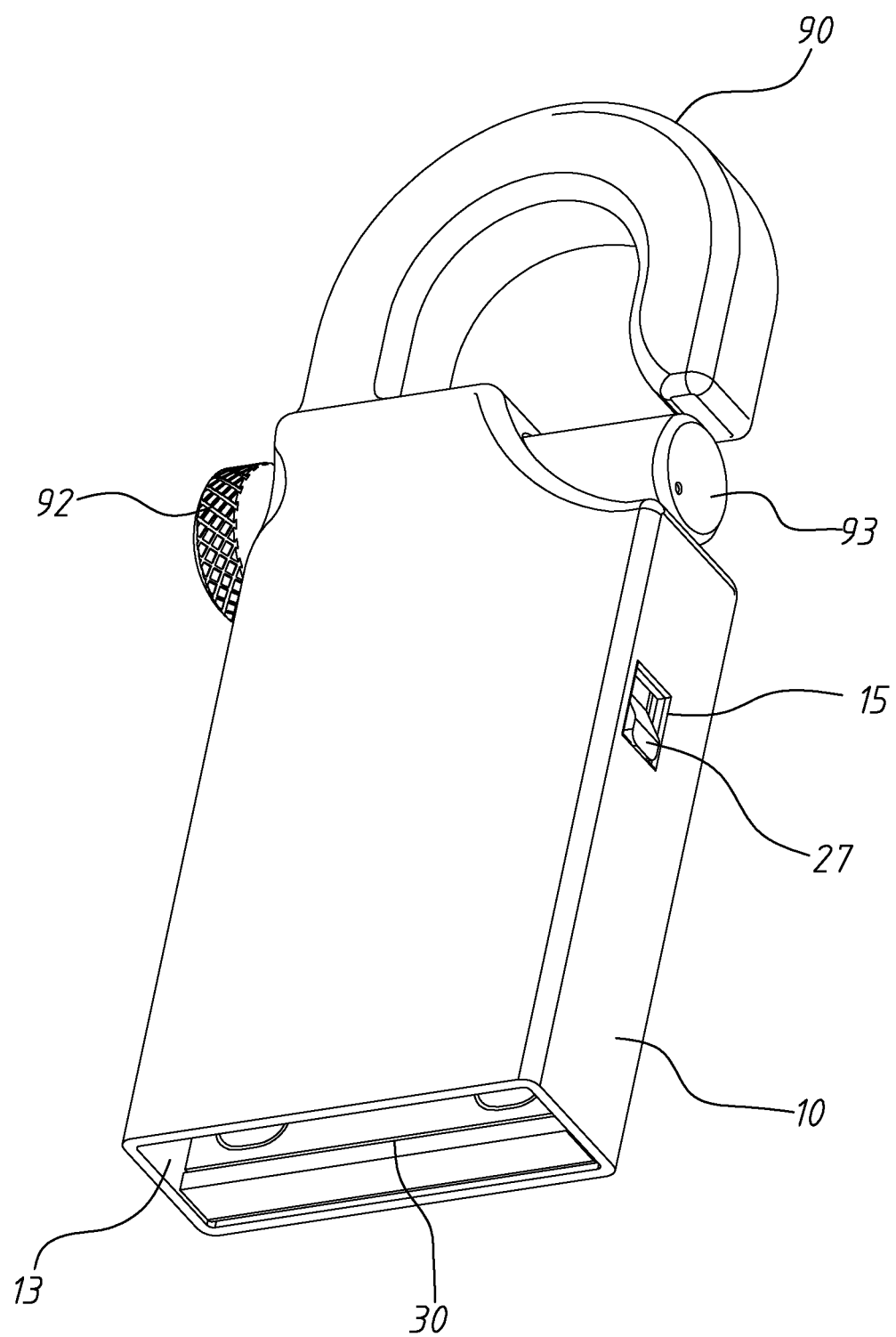
FIG. 1 is an oblique top elevational view of a memory stick in accordance with the present invention.
Figures 2, 3:
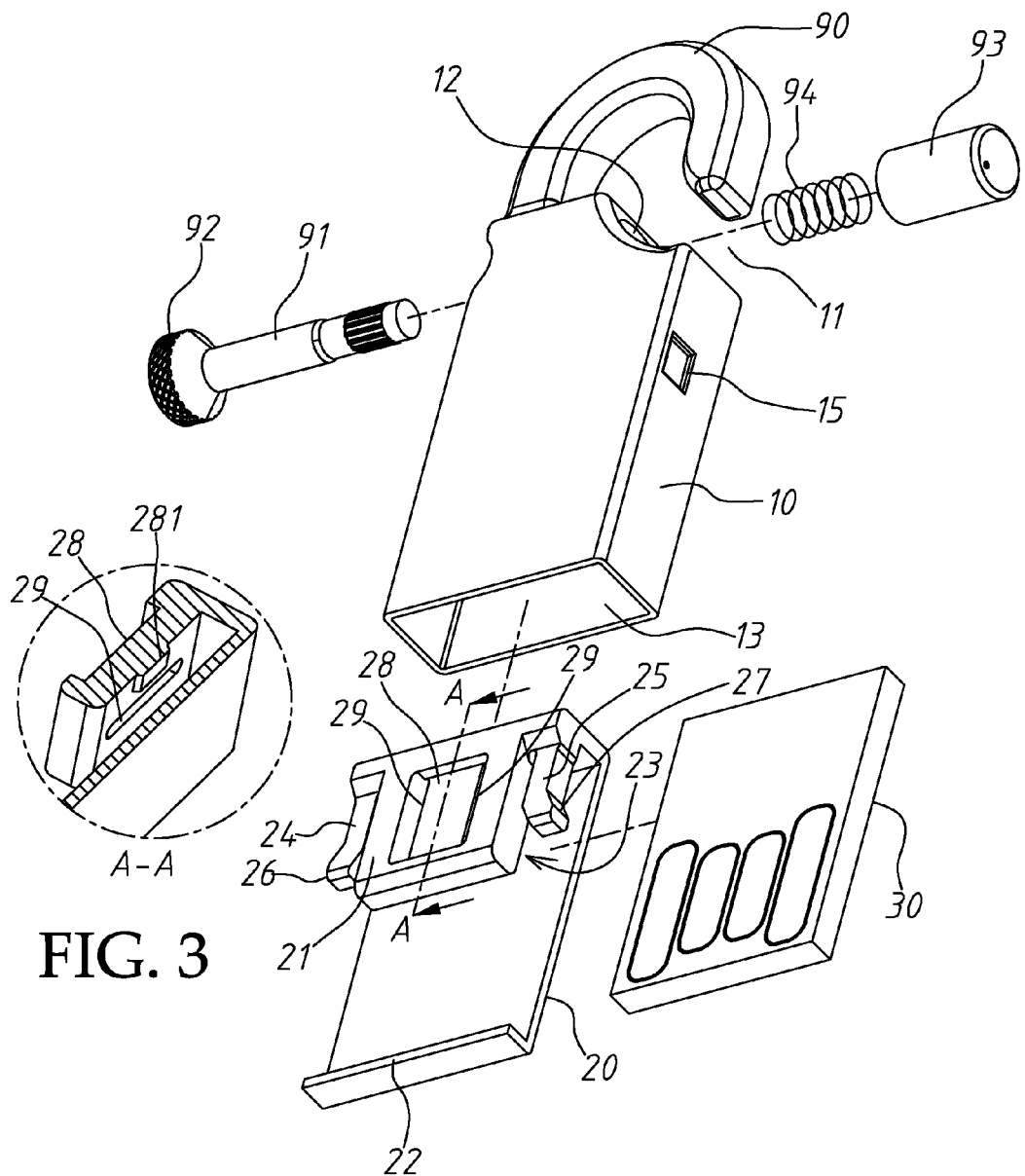
FIG. 2 is an exploded view of the memory stick shown in FIG. 1.
FIG. 3 is a sectional view taken along line A-A of FIG. 2.

Referring to FIGS. 1 and 2, a memory stick in accordance with the present invention is shown. The memory stick comprises a casing 10, a positioning tray 20, and a flash memory 30. The flash memory 30 is mounted in the positioning tray 20, and then mounted with the positioning tray 20 in the casing 10.

The casing 10 comprises a connection member 90 located at one end thereof for connection to a key ring or other personal item (not shown). In this embodiment, the connection member 90 is a shackle. The connection member 90 (shackle) has its one end fixedly connected to one end, namely, the top end of the casing 10, and its other end spaced from the top end of the casing 10 by a gap 11. The casing 10 further comprises a transverse through hole 12 transversely disposed in communication with the gap 11 for the mounting of a closing and opening device. In this embodiment, the closing and opening device comprises a control rod 91 inserted through the transverse through hole 12 and having an operating head 92 located at one end thereof and suspending outside the casing 10 for pulling by a user's hand, a stopper block 93 affixed to an opposite end of the control rod 91 for blocking the gap 11, and a spring member 94 mounted around the control rod 91 and stopped between a part of the casing 10 around one end of the transverse through hole 12 and the stopper block 93 to impart a pressure to the stopper block 93 in direction toward the gap 11. Thus, the stopper block 93 is normally forced by the spring member 94 to block the gap 11 (see FIG. 4). However, a user can pull the operating head 92 to move the stopper block 93 in direction away from the gap 11, thereby opening the gap 11.

Figures 4, 5:
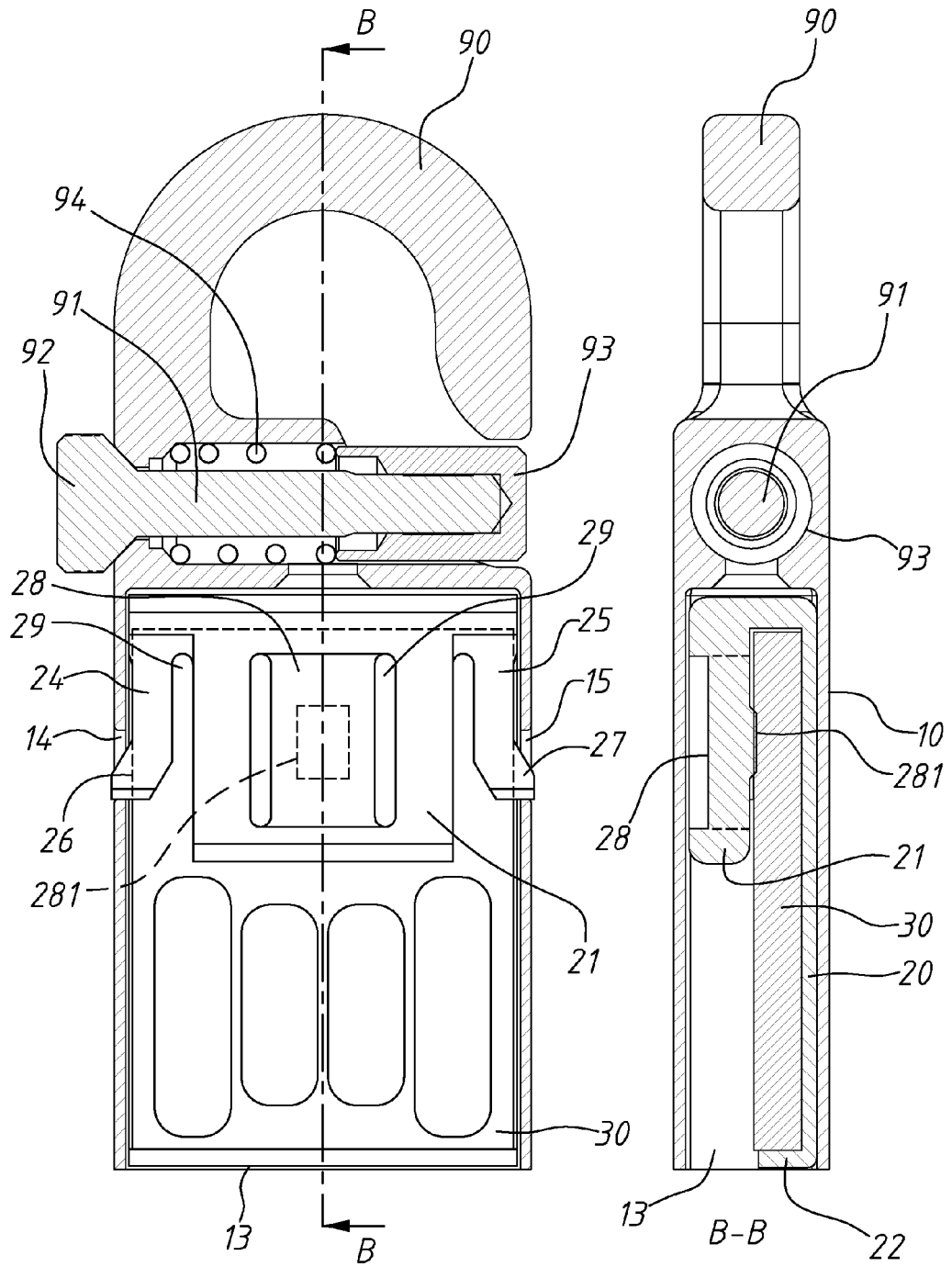
FIG. 4 is a sectional view of the memory stick shown in FIG. 1.
FIG. 5 is a sectional view taken along line B-B of FIG. 4.

The casing 10 is a flat frame shell having an opening 13 at an opposite end, namely, the bottom end thereof, two locating holes 14 and 15 respectively located in two opposite lateral sides thereof at a selected elevation (see FIG. 2 and FIG. 4). The positioning tray 20 is configured to fit the inside space of the casing 10, comprising an angled upper bending plate 21 upwardly extended from a top end of a bottom wall thereof to a predetermined height and then extended backwardly to a predetermined length, a bottom stop flange 22 perpendicularly located at a bottom end of the bottom wall thereof, a clamping space 23 defined between the upper bending plate 21 and the bottom wall of the positioning tray 20 for securing the flash memory 30, and two elastic arms 24 and 25 bilaterally extended from the upper bending plate 21 and respectively terminating in a respective hooked end portion 26 or 27 for engaging into the locating holes 14 and 15.

The positioning tray 20 further comprises an elastically deformable recessed portion 28 defined in a top side of the upper bending plate 21, and at least one protruding press portion 281 located at a bottom side of the recessed portion 28. The thickness of the recessed portion 28 is smaller than the thickness of the upper bending plate 21.

The positioning tray 20 further comprises at least one, for example, two elongated slots 29 cut through opposing top and bottom surfaces of the recessed portion 28 at two opposite lateral sides to enhance the elasticity of the recessed portion 28.

After insertion of the flash memory 30 in the clamping space 23 in the positioning tray 20, the bottom stop flange 22 is abutted against a bottom end of the flash memory 30. Thereafter, the positioning tray 20 with the flash memory 30 are inserted through the opening 13 into the inside of the casing 10 to force the hooked end portions 26 and 27 of the two elastic arms 24 and 25 into engagement with the respective locating holes 14 and 15 of the casing 10 (see FIGS. 1 and 4). Subject to the elastic material property of the elastic arms 24 and 25, the elastic arms 24 and 25 can be elastically deformed and smoothly inserted into the inside of the casing 10. After insertion of the positioning tray 20 into the end in the casing 10, the hooked end portions 26 and 27 of the two elastic arms 24 and 25 are kept in alignment with the locating holes 14 and 15 of the casing 10 and then immediately forced by the elastic restoring force of the elastic arms 24 and 25 into the respective locating holes 14 and 15 of the casing 10 (see FIGS. 1 and 4). Further, a user can press the hooked end portions 26 and 27 of the two elastic arms 24 and 25 in an inward direction away from the respective locating holes 14 and 15 of the casing 10, allowing the positioning tray 20 to be taken out of the casing 10.

Referring to FIGS. 4 and 5, after insertion of the flash memory 30 into the clamping space 23 of the positioning tray 20 (see FIG. 2), the protruding press portion 281 is forced by the recessed portion 28 to abut against the surface of the flash memory 30 (see FIG. 5), thereby holding down the flash memory 30 firmly in the clamping space 23 of the positioning tray 20 (see FIG. 2).

As stated above, the memory stick of the present invention has a simple structural design that facilitates fabrication in an economic manner, can secure the flash memory firmly in the casing, and enables the user to conveniently take the flash memory out of the casing for application.

Although a particular embodiment of the invention has been described in detail for purposes of illustration, various modifications and enhancements may be made without departing from the spirit and scope of the invention. Accordingly, the invention is not to be limited except as by the appended claims.

What the invention claimed is:

1. A memory stick, comprising:
    a casing comprising a connection member located at a top end thereof for connection to an external object, an opening located in an opposing bottom end thereof, and a plurality of locating holes symmetrically located in two opposite lateral sides thereof;
    a positioning tray insertable through said opening into the inside of said casing, said positioning tray comprising an angled upper bending plate upwardly extended from a top end thereof and defining with a bottom wall thereof a clamping space, an elastically deformable recessed portion defined in said angled upper bending plate, said recessed portion being spaced apart from edges of said angled upper bending plate and having a thickness that is less than a thickness of said angled upper bending plate, and two elastic arms bilaterally extended from said angled upper bending plate and respectively terminating in at least one respective hooked end portion, the hooked end portions of said two elastic arms being respectively forced into said locating holes of said casing after insertion of said positioning tray through said opening into the inside of said casing; and
    a flash memory detachably mounted in said clamping space in said positioning tray and held down by said elastically deformable recessed portion;
    wherein, when said flash memory is located in said clamping space of said positioning tray, said angled upper bending plate, said elastically deformable recessed portion, said two elastic arms, and said hooked end portions of said positioning tray are located above an upper surface of said flash memory;
    wherein said positioning tray further comprises at least one protruding press portion located on bottom side of said recessed portion, a bottom of said at least one protruding press portion is located below a bottom of said angled upper bending plate and said bottom of said at least one protruding press portion engaging a top of said flash memory and securing said flash memory in said clamping space, said bottom of said angled upper bending plate surrounding said at least one protruding press portion is spaced apart from said top of said flash memory.

2. The memory stick as claimed in claim 1, wherein said positioning tray further comprises at least one elongated slot cut through opposing top and bottom surfaces of said recessed portion.

3. The memory stick as claimed in claim 2, wherein said positioning tray comprises a plurality of said elongated slots symmetrically located in said recessed portion at two opposite lateral sides.

4. The memory stick as claimed in claim 1, wherein said angled upper bending plate, said elastically deformable recessed portion, said two elastic arms, and said hooked end portions of said positioning tray are integrally formed.

* * * * *